US008716646B2

(12) United States Patent
Hirose

(10) Patent No.: US 8,716,646 B2
(45) Date of Patent: May 6, 2014

(54) PHOTOELECTRIC CONVERSION DEVICE AND METHOD FOR OPERATING THE SAME

(75) Inventor: Atsushi Hirose, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 316 days.

(21) Appl. No.: 13/252,226

(22) Filed: Oct. 4, 2011

(65) Prior Publication Data

US 2012/0085892 A1 Apr. 12, 2012

(30) Foreign Application Priority Data

Oct. 8, 2010 (JP) ................................. 2010-228046

(51) Int. Cl.
*H01J 40/14* (2006.01)

(52) U.S. Cl.
USPC ..................................................... 250/214 R

(58) Field of Classification Search
USPC ......................................... 250/214 R, 214 A
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,253,391 B2 * | 8/2007 | Koyama et al. | 250/214 C |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Thanh Luu
(74) *Attorney, Agent, or Firm* — Eric J. Robinson; Robinson Intellectual Property Law Office, P.C.

(57) ABSTRACT

In a photoelectric conversion device including a photodiode and a current mirror circuit, a diode-connected transistor is provided in parallel with the photodiode. The transistor serves as a leakage path for rapidly discharging charge stored in the gate capacitance in the current mirror circuit. Thus, the response speed of the photoelectric conversion device is increased, and output of an abnormal value is reduced.

23 Claims, 13 Drawing Sheets

(56) References Cited

U.S. PATENT DOCUMENTS

| | | | |
|---|---|---|---|
| 7,462,862 B2 | 12/2008 | Hoffman et al. | |
| 7,468,304 B2 | 12/2008 | Kaji et al. | |
| 7,495,272 B2 | 2/2009 | Maruyama et al. | |
| 7,501,293 B2 | 3/2009 | Ito et al. | |
| 7,674,650 B2 | 3/2010 | Akimoto et al. | |
| 7,705,283 B2 | 4/2010 | Arao et al. | |
| 7,732,819 B2 | 6/2010 | Akimoto et al. | |
| 7,932,126 B2 | 4/2011 | Maruyama et al. | |
| 8,263,926 B2 | 9/2012 | Arao et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-136392 | 5/2005 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG—Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IgZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GiZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IgZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD'08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-

(56) References Cited

OTHER PUBLICATIONS

OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics ) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters ) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

● In
○ Sn
◇ Zn
• O

● In
● Ga
● Zn
● O

PHOTOELECTRIC CONVERSION DEVICE AND METHOD FOR OPERATING THE SAME

BACKGROUND OF THE INVENTION

1. Field of the Invention

The present invention relates to a photoelectric conversion device having a circuit including a transistor.

2. Description of the Related Art

A number of photoelectric conversion devices used for detecting electromagnetic waves are generally known. For example, photoelectric conversion devices having sensitivity ranging from ultraviolet rays to infrared rays are collectively referred to as optical sensors. An optical sensor having sensitivity to light in a visible light region with a wavelength of 400 nm to 700 nm is particularly referred to as a visible light sensor. A large number of visible light sensors are used for devices that require illuminance adjustment, on/off control, or the like depending on human living environment.

Known examples of visible light sensors are a photodiode that is a photoelectric conversion element utilizing photoelectric conversion properties of single crystal silicon or amorphous silicon, and a photo IC provided with a phototransistor or an amplifier circuit that amplifies an output of a photodiode.

For example, Patent Document 1 discloses an example of a photo IC in which a photodiode using amorphous silicon and an amplifier circuit using polycrystalline silicon are formed over one substrate.

[Reference]

Patent Document 1: Japanese Published Patent Application No. 2005-136392

SUMMARY OF THE INVENTION

A current mirror circuit is used in the amplifier circuit in the above-described photo IC, which means that the circuit configuration is simple because the current mirror circuit can be constituted only by transistors of one conductivity type. However, since gates of a plurality of transistors are connected in parallel with each other, a problem arises in which it takes a long time to discharge charge stored in the gate capacitance when the transistors are off.

If the time for discharging the charge stored in the gate capacitance is long when the transistors are off, an abnormal value is sometimes output because of the influence of remaining charge. In particular, an abnormal value is likely to be output when the illuminance is changed from high illuminance to low illuminance.

In view of the above problem, an object of one embodiment of the present invention is to provide a photoelectric conversion device in which the above problem is solved and a method for operating the photoelectric conversion device.

One embodiment of the present invention disclosed in this specification is a photoelectric conversion device that includes a current mirror circuit, a photodiode, and a diode-connected transistor connected in parallel with the photodiode. A feature lies in that charge stored in gate capacitance in the current mirror circuit is rapidly discharged through the diode-connected transistor.

One embodiment of the present invention disclosed in this specification is a photoelectric conversion device including a photodiode, a first transistor, a plurality of second transistors, and a third transistor. An anode of the photodiode is electrically connected to a drain electrode and a gate electrode of the first transistor, gate electrodes of the plurality of second transistors, and a drain electrode and a gate electrode of the third transistor. A cathode of the photodiode, drain electrodes of the plurality of second transistors, and a source electrode of the third transistor are electrically connected to a first terminal. A source electrode of the first transistor and source electrodes of the plurality of second transistors are electrically connected to a second terminal.

In this specification and the like, ordinal numbers such as "first", "second", and "third" are used in order to avoid confusion among components, and the terms do not limit the components numerically.

The first terminal is electrically connected to a wiring that can switch between a high power supply potential and a ground potential to be supplied. The second terminal is electrically connected to a wiring that supplies a low power supply potential. By setting the first terminal at the ground potential when the photoelectric conversion device is off, charge stored in the gate capacitance of each transistor included in the circuit can be discharged through the photodiode and the third transistor.

In the above circuit configuration, the first to third transistors can be n-channel transistors. Note that one or more or all of the transistors can be p-channel transistors.

The third transistor is preferably formed using an oxide semiconductor. The off-state current of a transistor in which an oxide semiconductor is used for a channel formation region is extremely low and is lower than the dark current of a photodiode; therefore, the photoelectric conversion device can operate over a wide dynamic range even when such a transistor is connected in parallel with a photodiode as in the above circuit.

The gate width of the third transistor is preferably larger than that of the first transistor. The gate length of the third transistor is preferably smaller than that of the first transistor. With such a structure, charge stored in the gate capacitance of each transistor included in the circuit can be rapidly discharged.

Another embodiment of the present invention disclosed in this specification is a method for operating a photoelectric conversion device in which an anode of a photodiode is electrically connected to a drain electrode and a gate electrode of a first transistor, gate electrodes of a plurality of second transistors, and a drain electrode and a gate electrode of a third transistor; a cathode of the photodiode, drain electrodes of the plurality of second transistors, and a source electrode of the third transistor are electrically connected to a first terminal; and a source electrode of the first transistor and source electrodes of the plurality of second transistors are electrically connected to a second terminal. The first terminal is set at a high power supply potential and the second terminal is set at a low power supply potential to apply a reverse bias to the photodiode. A gate potential generated from a current supplied from the photodiode to the first transistor is supplied to the gate electrodes of the plurality of second transistors. A signal is output from the first transistor and the plurality of second transistors. After that, the first terminal is set at a ground potential. Part of charge stored in gate capacitance of the first transistor and the plurality of second transistors is discharged to the first terminal side through the third transistor.

According to one embodiment of the present invention, the time for discharging charge stored in the gate capacitance in a current mirror circuit can be shortened. In addition, it is possible to provide a photoelectric conversion device in which output of an abnormal value is reduced because of improvement in the response characteristics.

DETAILED DESCRIPTION OF THE INVENTION

Figure 1:
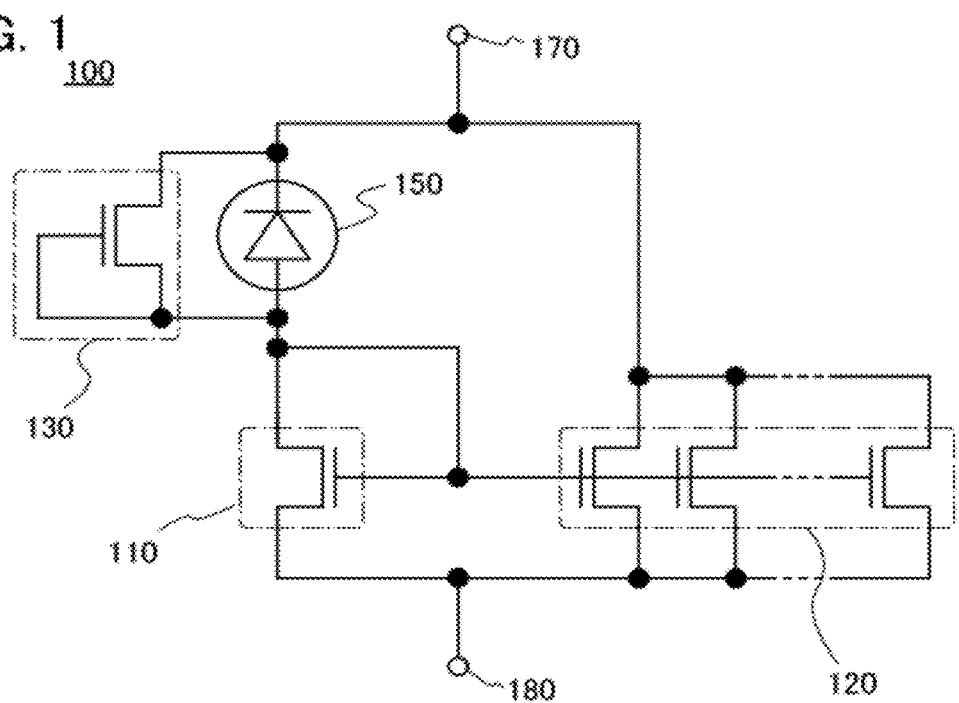
FIG. 1 is a circuit diagram illustrating a photoelectric conversion device according to one embodiment of the present invention.

Embodiments of the present invention will be described below with reference to the accompanying drawings. Note that the present invention can be carried out in many different modes, and it is easily understood by those skilled in the art that various changes and modifications can be made without departing from the spirit and scope of the present invention. Therefore, the present invention should not be limited to the descriptions of the embodiments. In the drawings for explaining the embodiments, the same portions or portions having similar functions are denoted by the same reference numerals, and description of such portions is not repeated.

A structure and operation of a photoelectric conversion device according to one embodiment of the present invention will be described in this embodiment.

FIG. 1 is a circuit diagram of a photoelectric conversion device according to one embodiment of the present invention. A photoelectric conversion device 100 includes a current mirror circuit constituted by a first transistor 110 that is a transistor on the input side and a second transistor 120 that is a transistor on the output side, and also includes a third transistor 130 that serves as a leakage path of charge stored in gate capacitance, a photodiode 150, a high potential side terminal 170, and a low potential side terminal 180. Note that all the transistors are n-channel transistors.

The cathode side of the photodiode 150, a source electrode of the third transistor 130, and a drain electrode of the second transistor 120 are connected to the high potential side terminal 170. A source electrode of the first transistor 110 and a source electrode of the second transistor 120 are connected to the low potential side terminal 180. A drain electrode and a gate electrode of the first transistor 110, a gate electrode of the second transistor 120, and a drain electrode and a gate electrode of the third transistor 130 are connected to the anode side of the photodiode 150.

Here, the number of stages of the second transistors 120 is one or more to obtain a desired output, and can be freely determined by a practitioner. As an example, FIG. 1 illustrates a structure where plural stages of the second transistors 120 are connected to each other.

As the photodiode 150, a PN photodiode formed using single crystal silicon, a PIN photodiode formed using polycrystalline silicon or amorphous silicon, or the like can be used. In order to use the photoelectric conversion device 100 in this embodiment as an optical sensor, a photodiode for an intended wavelength is selected. For example, a photodiode formed using amorphous silicon is preferably used to detect light in the visible wavelength range, and a photodiode formed using single crystal silicon or polycrystalline silicon is preferably used to detect light in a wavelength range including infrared rays.

The first transistor 110, the second transistor 120, and the third transistor 130 can be formed using a silicon semiconductor or an oxide semiconductor. Examples of a silicon semiconductor are single crystal silicon and polycrystalline silicon. An example of an oxide semiconductor is In—Ga—Zn—O-based metal oxide. For example, the transistor can be formed using a single crystal silicon wafer or polycrystalline silicon or an oxide semiconductor over a substrate having an insulating surface, such as a glass substrate.

An oxide semiconductor to be used preferably contains at least indium (In) or zinc (Zn). In particular, the oxide semiconductor preferably contains In and Zn. As a stabilizer for reducing variation in electric characteristics of a transistor including the oxide semiconductor, the oxide semiconductor preferably contains gallium (Ga) in addition to In and Zn. Moreover, the oxide semiconductor preferably contains tin (Sn), hafnium (Hf), and/or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Examples of the oxide semiconductor to be used are an indium oxide; a tin oxide; a zinc oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; an oxide of three metal elements, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and an oxide of four metal elements, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

An In—Ga—Zn-based oxide semiconductor material has sufficiently high resistance when there is no electric field and thus has a sufficiently low off-state current.

In addition, the In—Ga—Zn-based oxide semiconductor material has a high field-effect mobility. Further, in a transistor including an In—Sn—Zn-based oxide semiconductor material, the field-effect mobility can be three times or more as high as that of a transistor including the In—Ga—Zn-based oxide semiconductor material, and the threshold voltage is likely to be positive. These semiconductor materials are one of the materials that can be favorably used for a transistor included in a semiconductor device according to one embodiment of the present invention.

Note that here, for example, an "In—Ga—Zn-based oxide" means an oxide containing In, Ga, and Zn as its main components and there is no particular limitation on the composition ratio of In, Ga, and Zn. Further, a metal element in addition to In, Ga, and Zn may be contained.

Further, a material represented by $In/MO_3(ZnO)_m$ (m is larger than 0 and is not an integer) may be used as the oxide semiconductor. Note that M represents one or more metal elements selected from Ga, Fe, Mn, and Co. As the oxide semiconductor, a material represented by $In_3SnO_5(ZnO)_n$ (n is larger than 0 and is an integer) may be used. For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier density, impurity concentration, defect density, atomic ratio of a metal element to oxygen, bond distance, density, or the like.

For example, high mobility can be relatively easily obtained with an In—Sn—Zn-based oxide. Even when an In—Ga—Zn-based oxide is used, the mobility can be increased by a reduction in defect density in bulk.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \le r^2$, and r may be 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by the following formula.

$$R_a = \frac{1}{S_0}\int_{y_1}^{y_2}\int_{x_1}^{x_2}|f(x,y)-Z_0|\,dx\,dy \qquad \text{[Formula 1]}$$

Note that in Formula 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

The target for forming the oxide semiconductor layer 144 by sputtering is, for example, an oxide target having a composition ratio of $In_2O_3$:$Ga_2O_3$:$ZnO$=1:1:1 [molar ratio]. Alternatively, an oxide target having a composition ratio of $In_2O_3$:$Ga_2O_3$:$ZnO$=1:1:2 [molar ratio] may be used.

In the case where an In—Zn—O-based material is used as the oxide semiconductor, a target used has a composition ratio of In:Zn=50:1 to 1:2 in an atomic ratio ($In_2O_3$:$ZnO$=25:1 to 1:4 in a molar ratio), preferably In:Zn=20:1 to 1:1 in an atomic ratio ($In_2O_3$:$ZnO$=10:1 to 1:2 in a molar ratio), further preferably In:Zn=15:1 to 1.5:1 ($In_2O_3$:$ZnO$=15:2 to 3:4 in a molar ratio). For example, when a target used for forming an In—Zn-based oxide semiconductor has an atomic ratio of In:Zn:O=X:Y:Z, the relation of Z>1.5X+Y is satisfied.

An In—Sn—Zn-based oxide can be referred to as ITZO. For ITZO, an oxide target having a composition ratio of In:Sn:Zn=1:2:2, 2:1:3, 1:1:1, or 20:45:35 in an atomic ratio is used, for example.

Here, as the oxide semiconductor having crystallinity, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 11A to 11E, FIGS. 12A to 12C, and FIGS. 13A to 13C. In FIGS. 11A to 11E, FIGS. 12A to 12C, and FIGS. 13A to 13C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 11A to 11E, 0 surrounded by a circle represents tetracoordinate O and O surrounded by a double circle represents tricoordinate O.

Figure 11A:
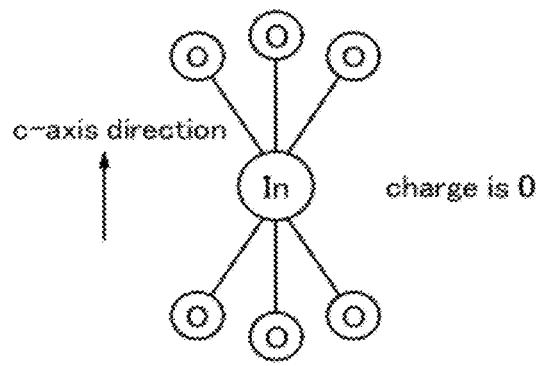
FIGS. 11A to 11E each illustrate a crystal structure of an oxide material.

FIG. 11A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 11A is actually an octahedral structure, but is illustrated as a planar structure for simplicity. Note that three tetracoordinate O atoms exist in each of an upper half and a lower half in FIG. 11A. In the small group illustrated in FIG. 11A, electric charge is 0.

Figure 11B:
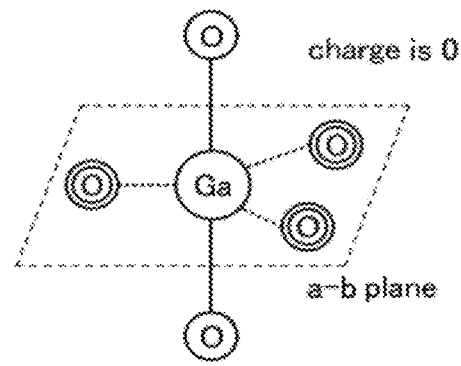

FIG. 11B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 11B. An In atom can also have the structure illustrated in FIG. 11B because an In atom can have five ligands. In the small group illustrated in FIG. 11B, electric charge is 0.

Figure 11C:
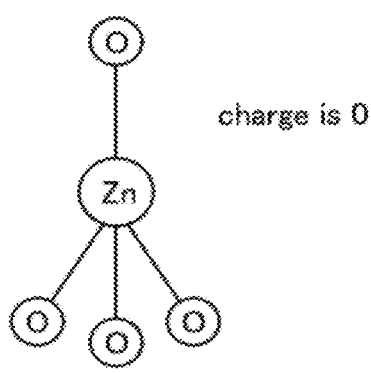

FIG. 11C illustrates a structure including one tetracoordinate Zn atom and four tetracoordinate O atoms proximate to the Zn atom. In FIG. 11C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 11C. In the small group illustrated in FIG. 11C, electric charge is 0.

Figure 11D:
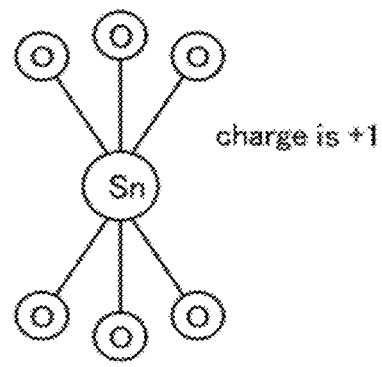

FIG. 11D illustrates a structure including one hexacoordinate Sn atom and six tetracoordinate O atoms proximate to the Sn atom. In FIG. 11D, three tetracoordinate O atoms exist in each of an upper half and a lower half. In the small group illustrated in FIG. 11D, electric charge is +1.

Figure 11E:
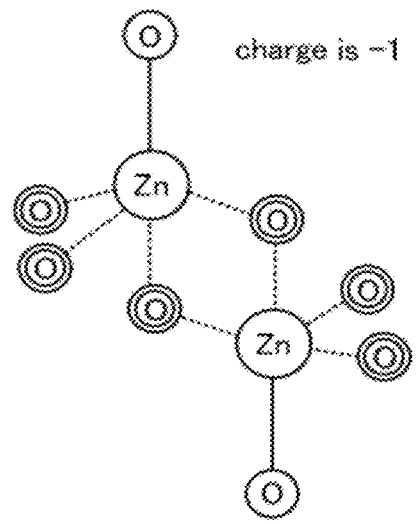

FIG. 11E illustrates a small group including two Zn atoms. In FIG. 11E, one tetracoordinate O atom exists in each of an upper half and a lower half. In the small group illustrated in FIG. 11E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 11A each have three proximate In atoms in the downward direction, and the three O atoms in the lower half each have three proximate In atoms in the upward direction. The one O atom in the upper half with respect to the pentacoordinate Ga atom in FIG. 11B has one proximate Ga atom in the downward direction, and the one O atom in the lower half has one proximate Ga atom in the upward direction. The one O atom in the upper half with respect to the tetracoordinate Zn in FIG. 11C atom has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate to and below the metal atom is equal to the number of the metal atoms proximate to and above each of the tetracoordinate O atoms. Since O atoms contributing the bonding between the small groups are the tetracoordinate O atoms, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

Figure 12A:
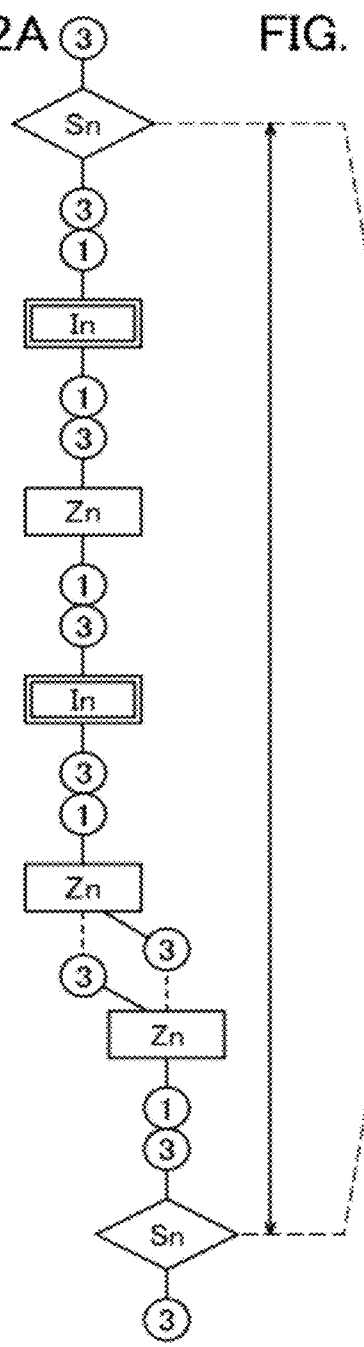
FIGS. 12A to 12C illustrate a crystal structure of an oxide material.
Figure 12B:
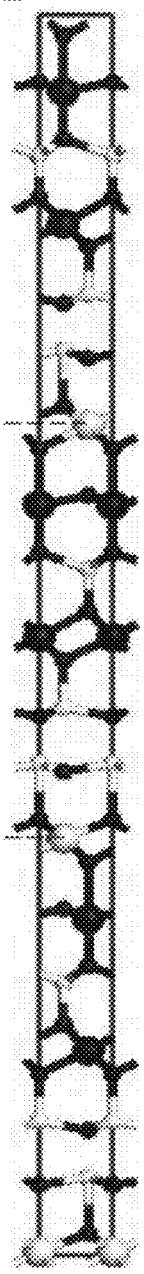
Figure 12C:
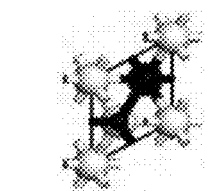

FIG. 12A illustrates a model of a medium group included in a layered structure of an In—Sn—Zn—O-based material. FIG. 12B illustrates a large group including three medium groups. FIG. 12C illustrates an atomic arrangement in the case where the layered structure in FIG. 12B is observed from the c-axis direction.

In FIG. 12A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 12A, one tetracoordinate O atom existing in each of an upper half and a lower half with respect to an In atom is denoted by circled 1. FIG. 12A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 12A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 11E can be given. For example, with one small group including two Zn atoms, electric charge of one small group including a Sn atom can be cancelled, so that the total electric charge of the layered structure can be 0.

When the large group illustrated in FIG. 12B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an oxide of four metal elements, such as an In—Sn—Ga—Zn-based oxide; an oxide of three metal elements, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide.

Figure 13A:
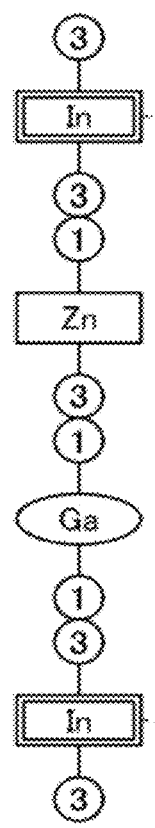
FIGS. 13A to 13C illustrate a crystal structure of an oxide material.

As an example, FIG. 13A illustrates a model of a medium group included in a layered structure of an In—Ga—Zn—O-based material.

In the medium group included in the layered structure of the In—Ga—Zn—O-based material in FIG. 13A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 13B:
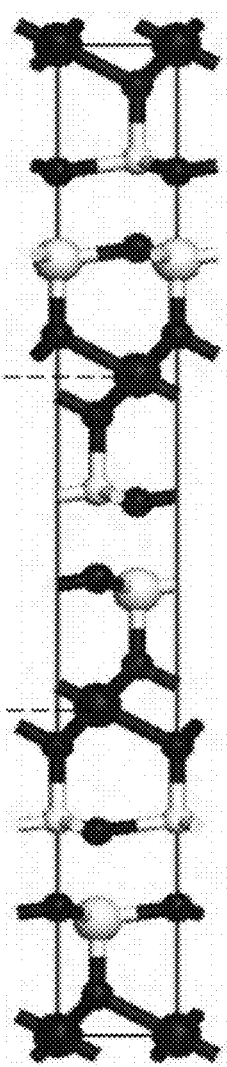
Figure 13C:
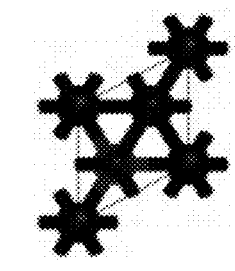

FIG. 13B illustrates a large group including three medium groups. FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 13A but also a medium group in which the arrangement of the In atom, the Ga atom, and the Zn atom is different from that in FIG. 13A.

When an oxide semiconductor is used for the first transistor 110, the second transistor 120, and/or the third transistor 130, a transistor formed using a silicon semiconductor may be used in combination. For example, an oxide semiconductor can be used for only the first transistor 110, only the third transistor 130, or the first transistor 110 and the third transistor 130, and the other transistor(s) can be a transistor formed using a silicon semiconductor. Needless to say, all the transistors may be formed using an oxide semiconductor.

The transistor formed using an oxide semiconductor has electric characteristics of extremely low off-state current. The oxide semiconductor is preferably purified by sufficient removal of impurities such as hydrogen or sufficient supply of oxygen. Specifically, the concentration of hydrogen in the oxide semiconductor is $5\times10^{19}$ atoms/cm$^3$ or lower, preferably $5\times10^{18}$ atoms/cm$^3$ or lower, further preferably $5\times10^{17}$ atoms/cm$^3$ or lower, for example. Note that the concentration of hydrogen in the oxide semiconductor is measured by secondary ion mass spectrometry (SIMS). The density of carriers generated due to a donor such as hydrogen in the oxide semiconductor, in which hydrogen is reduced to a sufficiently low concentration so that the oxide semiconductor is purified and in which defect states in an energy gap due to oxygen vacancy are reduced by sufficiently supplying oxygen as described above, is less than $1\times10^{12}$/cm$^3$, preferably less than $1\times10^{11}$/cm$^3$, further preferably less than $1.45\times10^{10}$/cm$^3$. In addition, for example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor having extremely favorable off-state current characteristics can be obtained.

Therefore, by using a transistor that is formed using an oxide semiconductor and thus has an extremely low off-state current as the first transistor 110, which is the transistor on the input side, an output of the photodiode at low illuminance can be accurately amplified, and the dynamic range can be increased. Note that the effect of using a transistor formed using an oxide semiconductor as the third transistor 130 is described later.

Figure 10:
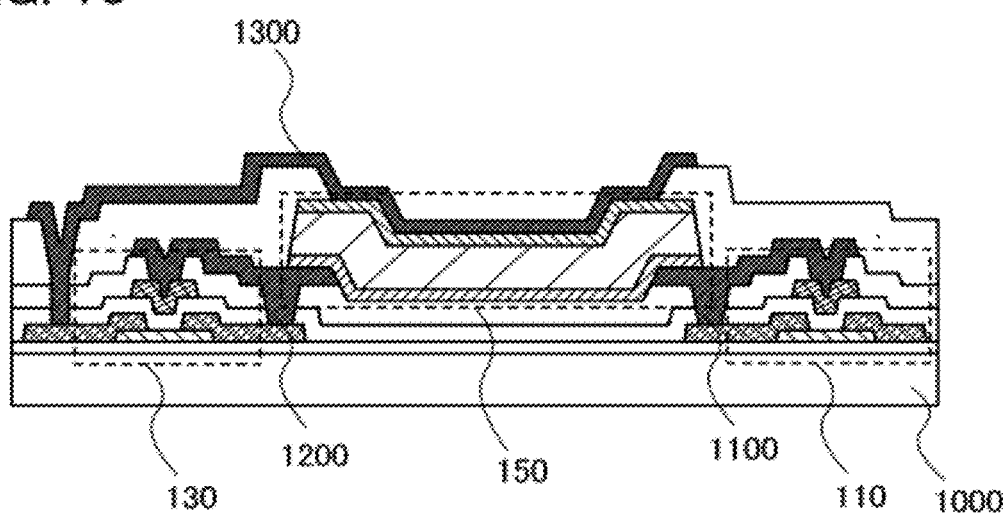
FIG. 10 is a cross-sectional view illustrating a photoelectric conversion device according to one embodiment of the present invention.

A cross-sectional view in FIG. 10 shows an example of connection between the photodiode 150, the first transistor 110, and the third transistor 130 in the circuit configuration illustrated in FIG. 1. The photodiode 150 exemplified in FIG. 10 is a PIN photodiode in which a P layer, an I layer, and an N layer are sequentially stacked from a glass substrate 1000 side, and the P layer side serves as the anode and the N layer side serves as the cathode. Each of the transistors 110 and 130 includes an oxide semiconductor layer, metal layers serving as a source electrode and a drain electrode, a gate insulating film, and a metal layer serving as a gate electrode.

A connection electrode 1100 to which the drain electrode and gate electrode of the first transistor 110 are connected and a connection electrode 1200 to which the drain electrode and gate electrode of the third transistor 130 are connected are in contact with the anode of the photodiode 150. A rear electrode 1300 connected to the source electrode of the third transistor 130 is in contact with the cathode of the photodiode 150. Using such connection relation, a photoelectric conversion device with the circuit configuration in FIG. 1 can be formed.

Note that FIG. 10 illustrates the top-gate transistor including an oxide semiconductor as an example; alternatively, the transistor may be a bottom-gate transistor. Moreover, the transistor may be formed using a silicon semiconductor material.

Figure 2:
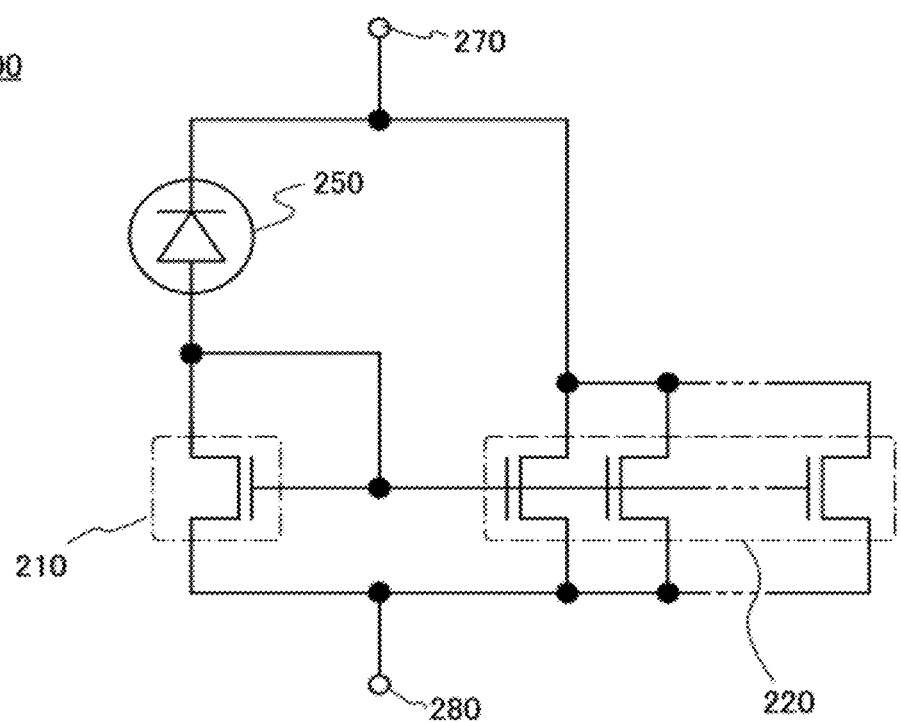
FIG. 2 is a circuit diagram illustrating a conventional photoelectric conversion device.

FIG. 2 is a circuit diagram illustrating an example of a conventional photoelectric conversion device, in which the third transistor 130 is omitted from the structure of the photoelectric conversion device 100 in FIG. 1 according to one embodiment of the present invention. An example of the operation of a conventional photoelectric conversion device 200 and its problem will be described.

First, in order to switch the photoelectric conversion device 200 from the off state to the on state, a high potential side terminal 270 is set at a high potential (e.g., a power supply potential) and a low potential side terminal 280 is set at a low potential (e.g., a ground potential).

When a photodiode 250 is irradiated with light in this state, a current flows through a first transistor 210. At this time, a gate voltage corresponding to the current flowing through the first transistor 210 is generated at a gate electrode of the first transistor 210 and a gate electrode of a second transistor 220 in accordance with the operation of a current mirror circuit.

A current supplied from the second transistor 220 in accordance with the gate voltage and the current flowing from the photodiode 250 to the first transistor 210 are combined and become an output current of the photoelectric conversion device 200. The photoelectric conversion device 200 can be used as an optical sensor or the like by judging the amount of the output current.

Then, in order to switch the photoelectric conversion device 200 from the on state to the off state, that is, in order to reset the photoelectric conversion device 200, the high potential side terminal 270 is made floating (open) or set at the ground potential.

At this time, charge stored in the gate capacitance of the first transistor 210 and the gate capacitance of the second transistor 220, that is, gate stored charge of the current mirror circuit is discharged through a path to the low potential side terminal 280 via the first transistor 210 or a path to the high potential side terminal 270 via the photodiode 250.

When the high potential side terminal 270 is floating, gate stored charge of the current mirror circuit is discharged not to the photodiode side but to the low potential side terminal through the first transistor 210. At this time, since the discharge amount of charge is decreased along with a reduction in the gate potential of the current mirror circuit, it takes a long time to sufficiently reduce the gate potential of the current mirror circuit.

Further, when the high potential side terminal 270 is set at the ground potential, the photodiode 250 is forward biased; thus, gate stored charge of the current mirror circuit is discharged through the path via the photodiode 250 in addition to the path via the first transistor 210. However, when the voltage applied to the photodiode 250 is lower than the forward voltage, the photodiode 250 can hardly discharge charge, so that it takes a long time to sufficiently reduce the gate potential of the current mirror circuit as in the above case.

When it takes a long time to reduce the gate potential of the current mirror circuit as above, an output defect occurs; for example, a signal at a higher level than an intended level is temporarily output.

For example, in the case where the environment is changed from high illuminance environment to low illuminance environment when the photoelectric conversion device 200 operates while being turned on and off repeatedly, the gate potential of the current mirror circuit cannot follow the illuminance and a signal higher than an intended signal is temporarily output in the low illuminance environment in some cases.

In view of such a problem, one embodiment of the present invention is to provide a photoelectric conversion device that can rapidly reduce the gate potential of the current mirror circuit to low level.

When a circuit connected to a ground line (e.g., a switching transistor) or the like is provided on the anode side of the photodiode 250, the gate potential of a current mirror circuit can be easily and rapidly decreased; however, this structure needs three terminals instead of two terminals in a conventional structure, and the operation becomes complicated. In contrast, according to one embodiment of the present invention, the gate potential of a current mirror circuit can be rapidly reduced to low level with two terminals as in a conventional structure.

Next, the operation of the photoelectric conversion device 100 according to one embodiment of the present invention, illustrated in FIG. 1, will be described.

The photoelectric conversion device 100 includes the third transistor 130 that is diode-connected and provided in parallel with the photodiode 150. The third transistor 130 is provided to realize a leakage path for discharging gate stored charge of the current mirror circuit constituted by the first transistor 110 and the second transistor 120 to the high potential side terminal 170.

First, in order to switch the photoelectric conversion device 100 from the off state to the on state, the high potential side terminal 170 is set at a high potential (e.g., a power supply potential) and the low potential side terminal 180 is set at a low potential (e.g., a ground potential). The method for obtaining the output current from the photoelectric conversion device 100 after this operation is the same as the operation method of the photoelectric conversion device 200 with the conventional structure.

At this time, the third transistor 130 is off; when the off-state current of the third transistor 130 is higher than the dark current of the photodiode 150, it is difficult to detect low illuminance and the dynamic range is decreased. For that reason, a transistor that is formed using an oxide semiconductor and thus has an extremely low off-state current is preferably used as the third transistor 130.

Then, in order to switch the photoelectric conversion device 100 from the on state to the off state, that is, in order to reset the photoelectric conversion device 100, the high potential side terminal 170 is set at the ground potential.

At this time, gate stored charge of the current mirror circuit is discharged through a path to the low potential side terminal 180 via the first transistor 110, a path to the high potential side terminal 170 via the photodiode 150, and a path to the high potential side terminal 170 via the third transistor 130.

The operation of discharging gate stored charge of the current mirror circuit through the path via the first transistor 110 and the path via the photodiode 150 is similar to that in the conventional photoelectric conversion device 200. In addition, in the photoelectric conversion device 100, the drain electrode and the gate electrode of the third transistor 130 are connected to the anode side of the photodiode 150 and the source electrode thereof is connected to the high potential side terminal 170. Therefore, when the high potential side terminal 170 is set at the ground potential, gate stored charge of the current mirror circuit can be discharged also through the path via the third transistor 130.

Since the third transistor 130 does not relate to the on operation of the photoelectric conversion device 100, the gate length and gate width of the third transistor 130 can be freely set. For example, when a transistor having a smaller gate length and a larger gate width than the first transistor 110 is used as the third transistor 130, the third transistor 130 can discharge gate stored charge of the current mirror circuit more rapidly than the first transistor 110. Further, FIG. 1 shows that the third transistor 130 is one diode-connected transistor; alternatively, a plurality of diode-connected transistors may be provided in parallel.

Note that in the photoelectric conversion device 100, the operation of discharging gate stored charge of the current mirror circuit through the third transistor 130 is performed when the high potential side terminal 170 is set at the ground potential to turn off the photoelectric conversion device 100. When the high potential side terminal 170 is made floating to turn off the photoelectric conversion device 100, the third transistor 130 is not turned on, so that the time for resetting gate stored charge of the current mirror circuit is equivalent to that in the conventional photoelectric conversion device 200.

As described above, with the circuit configuration of the photoelectric conversion device 100 including the third transistor 130, gate stored charge of the current mirror circuit can be rapidly discharged, and it is possible to provide the photoelectric conversion device that is less likely to output an abnormal value because of improvement in the response characteristics.

Figure 3:
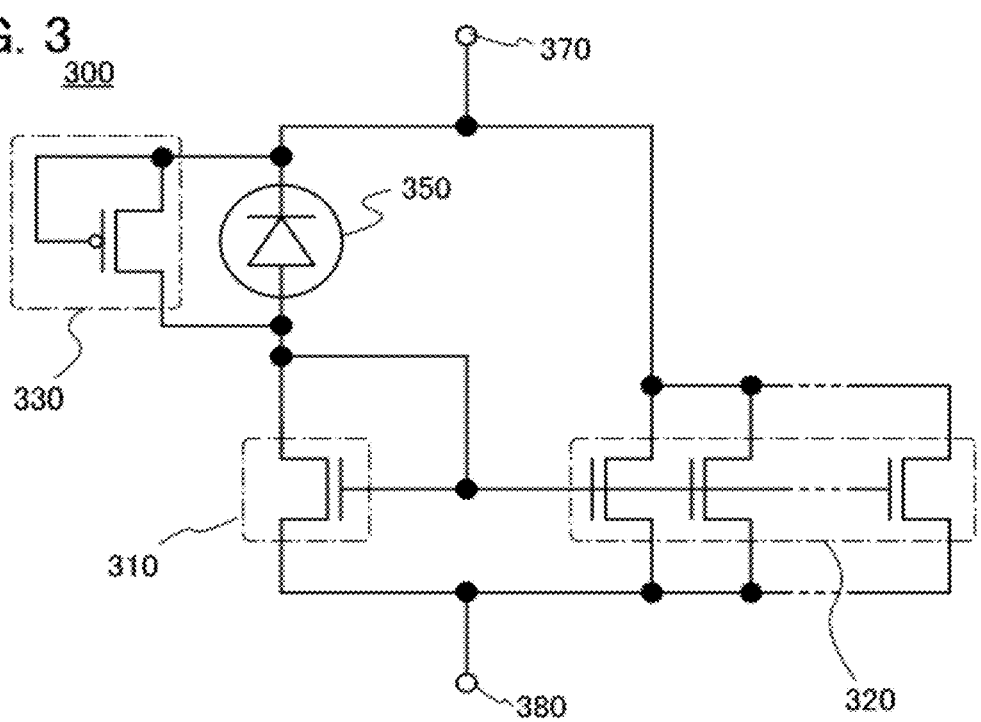
FIG. 3 is a circuit diagram illustrating a photoelectric conversion device according to one embodiment of the present invention.
Figure 4:
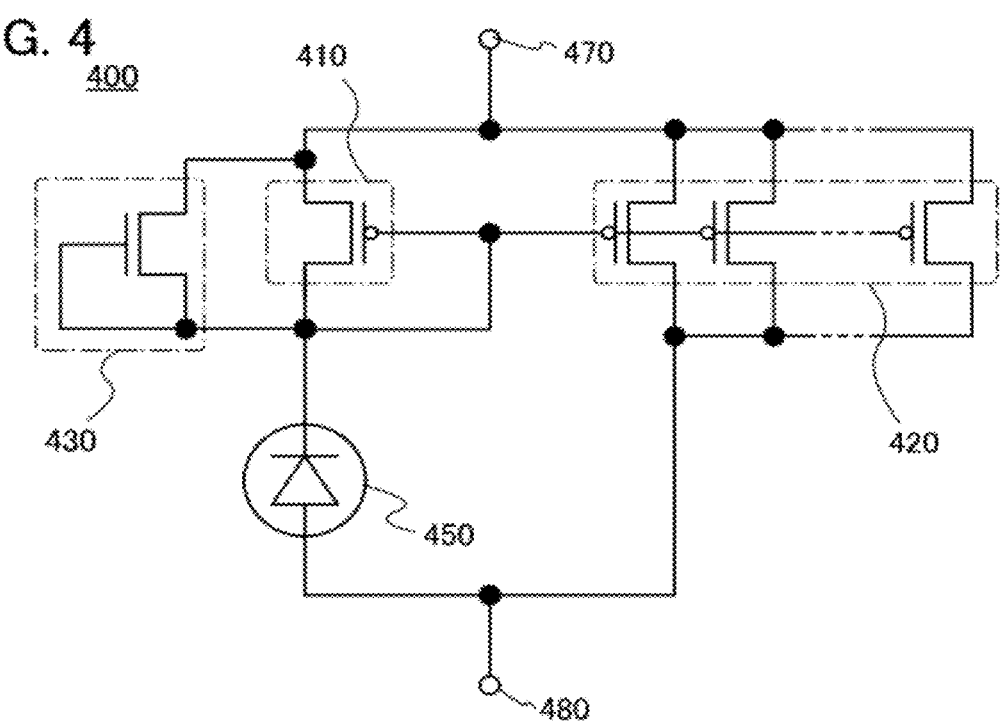
FIG. 4 is a circuit diagram illustrating a photoelectric conversion device according to one embodiment of the present invention.
Figure 5:
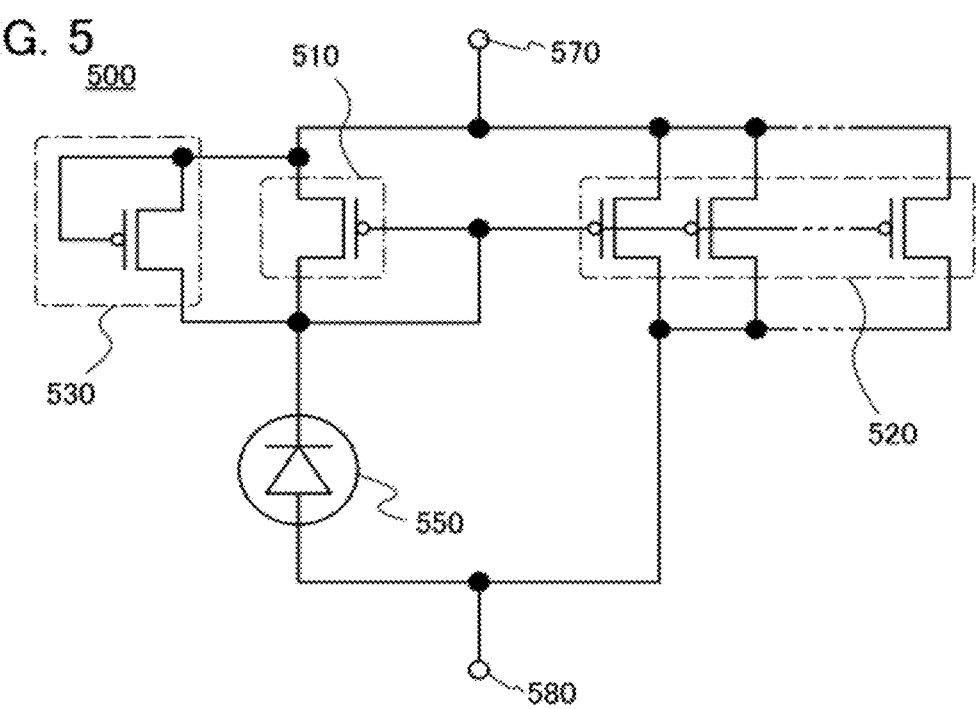
FIG. 5 is a circuit diagram illustrating a photoelectric conversion device according to one embodiment of the present invention.

Note that the configuration of the photoelectric conversion device 100 illustrated in FIG. 1 is an example of the configuration of the photoelectric conversion device according to one embodiment of the present invention, and circuit configurations illustrated in FIGS. 3 to 5 may be employed. The configurations and operations will be described below.

A photoelectric conversion device 300 illustrated in FIG. 3 includes a current mirror circuit constituted by a first transistor 310 that is a transistor on the input side and a second transistor 320 that is a transistor on the output side, and also includes a third transistor 330 that serves as a leakage path of charge stored in gate capacitance, a photodiode 350, a high potential side terminal 370, and a low potential side terminal 380. The first transistor 310 and the second transistor 320 are n-channel transistors. The third transistor 330 is a p-channel transistor.

The configuration of the photoelectric conversion device 300 except the third transistor 330 is the same as that of the photoelectric conversion device 100. The only difference is that a drain electrode and a gate electrode of the third transistor 330 are connected to the high potential side terminal 370 and a source electrode thereof is connected to the anode side of the photodiode 350.

In order to switch the photoelectric conversion device 300 from the off state to the on state, the high potential side terminal 370 is set at a high potential (e.g., a power supply potential) and the low potential side terminal 380 is set at a low potential (e.g., a ground potential).

When a photodiode 350 is irradiated with light in this state, a current flows through the first transistor 310. At this time, a gate voltage corresponding to the current flowing through the first transistor 310 is generated at a gate electrode of the first transistor 310 and a gate electrode of the second transistor 320.

A current supplied from the second transistor 320 in accordance with the gate voltage and the current flowing from the photodiode 350 to the first transistor 310 are combined and become an output current of the photoelectric conversion device 300.

Then, in order to switch the photoelectric conversion device 300 from the on state to the off state, the high potential side terminal 370 is set at the ground potential.

At this time, gate stored charge of the current mirror circuit is discharged through a path to the low potential side terminal 380 via the first transistor 310, a path to the high potential side terminal 370 via the photodiode 350, and a path to the high potential side terminal 370 via the third transistor 330.

In the photoelectric conversion device 300, the source electrode of the third transistor 330 is connected to the gate electrode of the second transistor 320 included in the current mirror circuit and the drain electrode and the gate electrode thereof are connected to the high potential side terminal 370. Therefore, when the high potential side terminal 370 is set at the ground potential, gate stored charge of the current mirror circuit can be discharged also through the path via the third transistor 330.

A photoelectric conversion device 400 illustrated in FIG. 4 includes a current mirror circuit constituted by a first transistor 410 that is a transistor on the input side and a second transistor 420 that is a transistor on the output side, and also includes a third transistor 430 that serves as a leakage path of charge stored in gate capacitance, a photodiode 450, a high potential side terminal 470, and a low potential side terminal 480. The first transistor 410 and the second transistor 420 are p-channel transistors. The third transistor 430 is an n-channel transistor.

A source electrode of the first transistor 410, a source electrode of the second transistor 420, and a source electrode of the third transistor 430 are connected to the high potential side terminal 470. The anode side of the photodiode 450 and a drain electrode of the second transistor 420 are connected to the low potential side terminal 480. A drain electrode and a gate electrode of the first transistor 410, a gate electrode of the second transistor 420, and a drain electrode and a gate electrode of the third transistor 430 are connected to the cathode side of the photodiode 450.

In order to switch the photoelectric conversion device 400 from the off state to the on state, the high potential side terminal 470 is set at a high potential (e.g., a power supply potential) and the low potential side terminal 480 is set at a low potential (e.g., a ground potential).

When the photodiode 450 is irradiated with light in this state, a current flows through the first transistor 410. At this time, a gate voltage corresponding to the current flowing through the first transistor 410 is generated at the gate electrode of the first transistor 410 and the gate electrode of the second transistor 420.

A current supplied from the second transistor 420 in accordance with the gate voltage and the current flowing from the first transistor 410 to the photodiode 450 are combined and become an output current of the photoelectric conversion device 400.

Then, in order to switch the photoelectric conversion device 400 from the on state to the off state, the high potential side terminal 470 is set at the ground potential.

At this time, gate stored charge of the current mirror circuit is discharged through a path to the high potential side terminal 470 via the third transistor 430.

In the photoelectric conversion device 400, the drain electrode and gate electrode of the third transistor 430 are connected to the gate electrode of the second transistor 420 included in the current mirror circuit and the source electrode thereof is connected to the high potential side terminal 470. Therefore, when the high potential side terminal 470 is set at the ground potential, gate stored charge of the current mirror circuit can be discharged through the path via the third transistor 430.

A photoelectric conversion device 500 illustrated in FIG. 5 has a current mirror circuit, and includes a first transistor 510 that is a transistor on the input side, a second transistor 520 that is a transistor on the output side, a third transistor 530 that serves as a leakage path of charge stored in gate capacitance, a photodiode 550, a high potential side terminal 570, and a low potential side terminal 580. The first transistor 510, the second transistor 520, and the third transistor 530 are p-channel transistors.

A source electrode of the first transistor 510, a source electrode of the second transistor 520, and a drain electrode and a gate electrode of the third transistor 530 are connected to the high potential side terminal 570. The anode side of the photodiode 550 and a drain electrode of the second transistor 520 are connected to the low potential side terminal 580. A drain electrode of the first transistor 510, a gate electrode of the second transistor 520, and a source electrode of the third transistor 530 are connected to the cathode side of the photodiode 550.

In order to switch the photoelectric conversion device 500 from the off state to the on state, the high potential side terminal 570 is set at a high potential (e.g., a power supply potential) and the low potential side terminal 580 is set at a low potential (e.g., a ground potential).

When the photodiode 550 is irradiated with light in this state, a current flows through the first transistor 510. At this time, a gate voltage corresponding to the current flowing through the first transistor 510 is generated at the gate electrode of the first transistor 510 and the gate electrode of the second transistor 520.

A current supplied from the second transistor 520 in accordance with the gate voltage and the current flowing from the first transistor 510 to the photodiode 550 are combined and become an output current of the photoelectric conversion device 500.

Then, in order to switch the photoelectric conversion device 500 from the on state to the off state, the high potential side terminal 570 is set at the ground potential.

At this time, gate stored charge of the current mirror circuit is discharged through a path to the high potential side terminal 570 via the third transistor 530.

In the photoelectric conversion device 500, the source electrode of the third transistor 530 is connected to the gate electrode of the second transistor 520 included in the current mirror circuit and the drain electrode and gate electrode thereof are connected to the high potential side terminal 570. Therefore, when the high potential side terminal 570 is set at the ground potential, gate stored charge of the current mirror circuit can be discharged through the path via the third transistor 530.

With any of the above-described circuit configurations, gate stored charge of the current mirror circuit can be rapidly discharged as in the circuit configuration illustrated in FIG. 1, and it is possible to provide the photoelectric conversion device that is less likely to output an abnormal value because of improvement in the response characteristics.

EXAMPLE

In this example, the results of verifying the effect of the configuration of the photoelectric conversion device according to one embodiment of the present invention with circuit simulation will be described.

The analog circuit simulator "SmartSpice" of Silvaco Inc. was used for circuit simulation to compare difference between response characteristics of the photoelectric conversion device according to one embodiment of the present invention and those of a conventional photoelectric conversion device.

Figure 6:
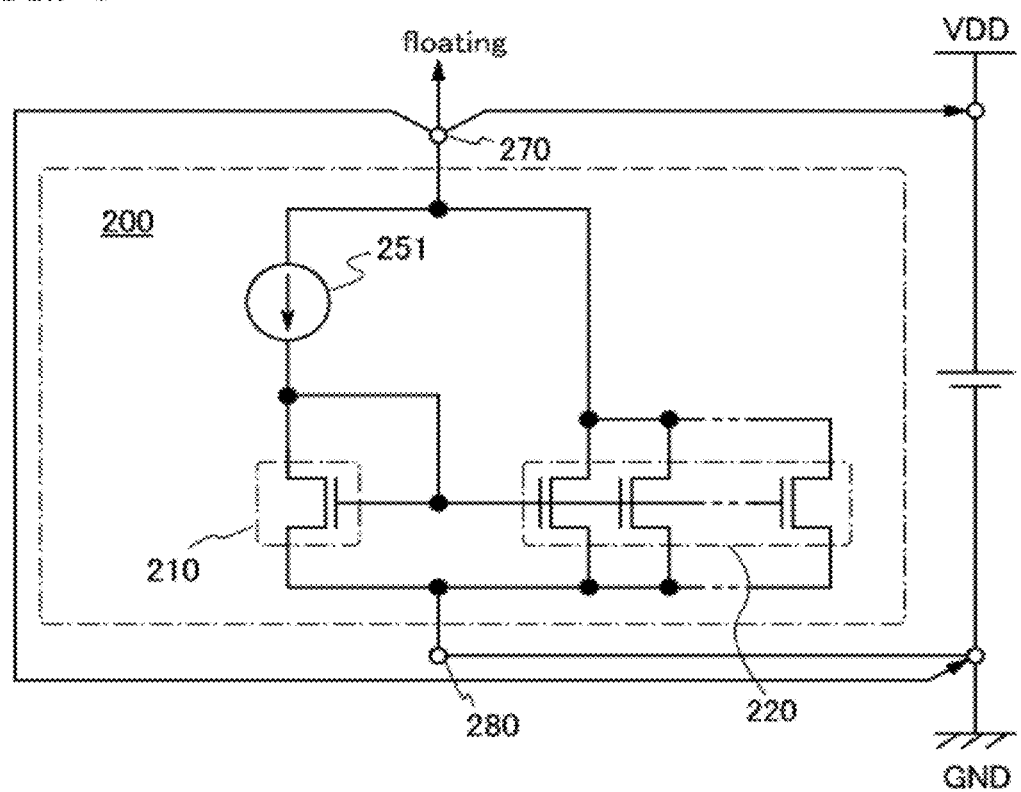
FIG. 6 is a circuit diagram of a photoelectric conversion device used for circuit simulation.
Figure 7:
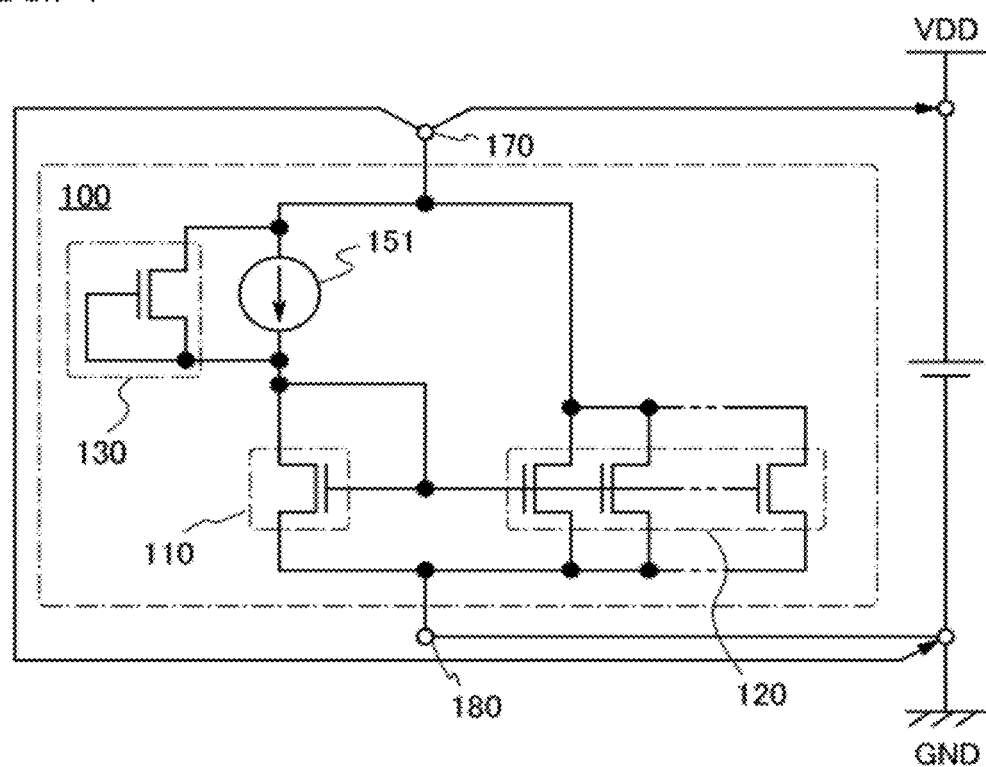
FIG. 7 is a circuit diagram of a photoelectric conversion device used for circuit simulation.

FIG. 6 and FIG. 7 are circuit diagrams of photoelectric conversion devices used for circuit simulation. FIG. 6 is a circuit diagram of a conventional photoelectric conversion device, which corresponds to the photoelectric conversion device 200. FIG. 7 is a circuit diagram of a photoelectric conversion device according to one embodiment of the present invention, which corresponds to the photoelectric conversion device 100 exemplified above. The photodiode is replaced with a current source 151 or a current source 251 that outputs a predetermined current. A power source and a selection circuit therefor are connected to each of the high potential side terminals 170 and 270. A low potential power source (a ground potential) is connected to each of the low potential side terminals 180 and 280. The following are parameters used for calculation. Note that the transistors are assumed to be formed using an oxide semiconductor.
(Current Mirror Circuit)
L/W=20 μm/30 μm
First transistor: 1 stage
Second transistor: 10000 stages
Field-effect mobility: 10 cm$^2$/Vs
Cut-off current: 1E-18 A
Off-state current: 1E-18 A
(Third Transistor)
Gate length: 20 μm
Gate width: 0 to 3000 μm
(Current Source)
Current value: 100 nA (which corresponds to a photodiode current when the photodiode is irradiated with light of 1000 1x)
(Others)
Power supply voltage: 2.2 V
Ambient temperature: Ta=25° C.

Figure 8A:
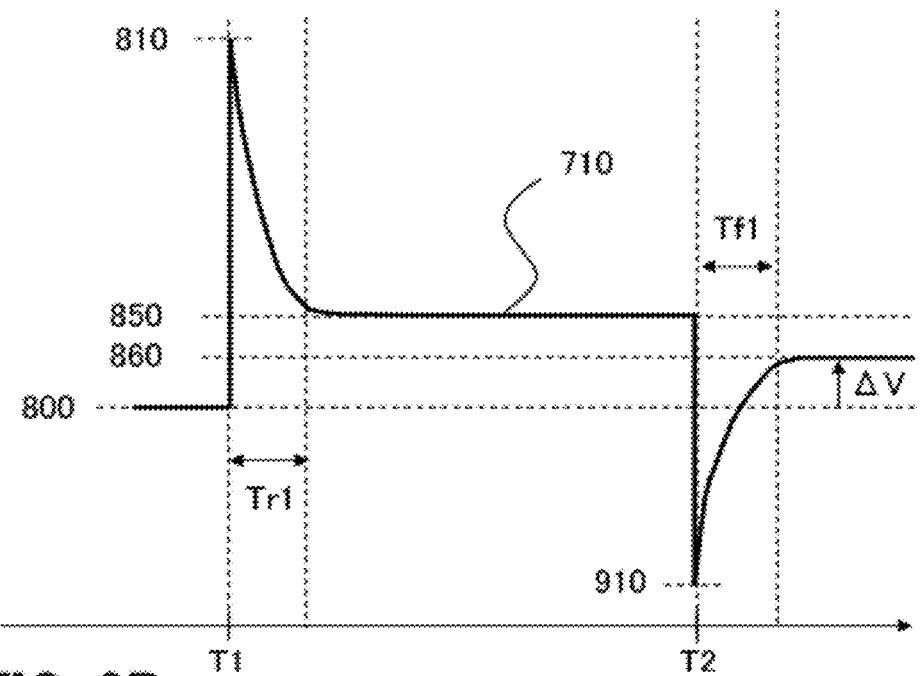
FIGS. 8A and 8B show results of circuit simulation.
Figure 8B:
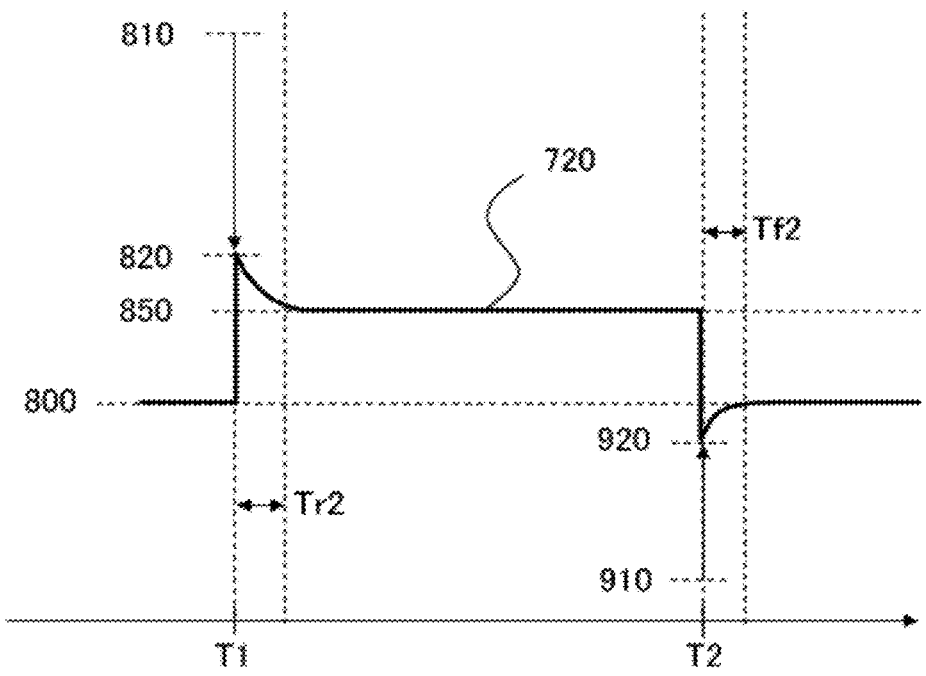

FIGS. 8A and 8B show results of the circuit simulation and illustrate waveforms of the gate potential of the current mirror circuit (the first transistor and the second transistor) with respect to the time axis (horizontal axis). Note that T1 represents a time at which the photoelectric conversion device is switched from off to on, and T2 represents a time at which the photoelectric conversion device is switched from on to off. The gate width of each of the third transistors 130 and 230 was 300 μm.

FIG. 8A shows the waveform of the gate potential of the current mirror circuit in the conventional photoelectric conversion device illustrated in FIG. 6. When the high potential side terminal 270 is set at a high potential, the low potential side terminal 280 is set at a low potential, and a given current is supplied from the current source 251 to the first transistor 210 at T1, a waveform 710 becomes a sharp waveform, which is steeply changed from a reset potential 800 to a potential 810. Then, through a rise time Tr1 (10% to 90%), the gate potential becomes a potential 850 that is a normal signal.

When the high potential side terminal 270 is made floating or set at a low potential at T2, the waveform 710 becomes a sharp waveform, which is steeply changed from the potential 850 to a potential 910, and the gate potential becomes a potential 860 through a fall time Tf1 (90% to 10%).

Here, the sharp waveforms generated at T1 and T2 are abnormal signals due to capacitive coupling between the photodiode and the transistor, and are the cause of lengthening Tr1 and Tf1. Further, the potential 860 after Tf1 is a potential that is higher than the reset potential 800 by ΔV, which is caused because it takes a long time to discharge gate stored charge of the current mirror circuit.

As has been described, the results of the circuit simulation confirmed problems of the conventional photoelectric conversion device, such as sharp waveforms at T1 and T2, the increase in Tr1 and Tf1 due to the sharp waveforms, and abnormal output after T2.

FIG. 8B shows the waveform of the gate potential of the current mirror circuit in the photoelectric conversion device according to one embodiment of the present invention, illustrated in FIG. 7. When the high potential side terminal 170 is set at a high potential, the low potential side terminal 180 is set at a low potential, and a given current is supplied from the current source 151 to the first transistor 110 at T1, a waveform 720 becomes a sharp waveform, which is changed from the reset potential 800 to a potential 820. Then, through a rise time Tr2 (10% to 90%), the gate potential becomes the potential 850, which is a normal signal.

When the high potential side terminal 170 is set at a low potential at T2, the waveform 720 becomes a sharp waveform, which is changed from the potential 850 to a potential 920, and the gate potential becomes the reset potential 800 through a fall time Tf2 (90% to 10%).

Here, the sharp waveforms generated at T1 and T2 are due to capacitive coupling between the photodiode and the transistor as in the conventional photoelectric conversion device. Since the third transistor 130 serving as a current path is connected in parallel with the photodiode, the capacitive coupling is reduced and the absolute value of the peak value is decreased from the potential 810 to the potential 820 and from the potential 910 to the potential 920. Consequently, a signal value close to the normal value can be obtained even immediately after T1 and T2, and the rise time Tr2 and the fall time Tf2 can be shorter than Tr1 and Tf1, respectively. In addition, since gate stored charge of the current mirror circuit is rapidly discharged through the third transistor 130, the potential after Tf2 becomes the reset potential 800 without causing ΔV as in the conventional photoelectric conversion device.

As has been described, the circuit simulation confirmed that in the photoelectric conversion device according to one embodiment of the present invention, the absolute value of the peak value was reduced and the rise time and fall time were shortened as compared to the conventional photoelectric conversion device. Moreover, the calculation results also confirmed that output of an abnormal signal after the fall time was reduced.

Next, the dependence on the gate width of the third transistor will be described with reference to FIG. 9.

Figure 9:
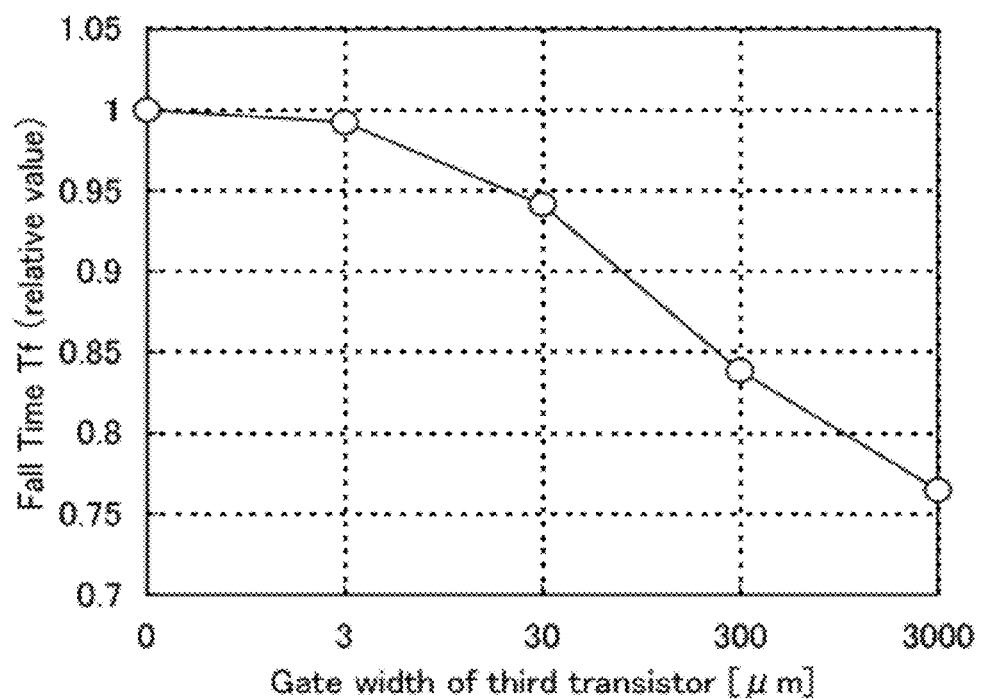
FIG. 9 shows a result of circuit simulation.

FIG. 9 shows the dependence of the fall time Tf on the gate width of the third transistor 130 in the circuit illustrated in FIG. 7. The fall time Tf is shown with a relative value, with Tf in the circuit of the conventional photoelectric conversion device without the third transistor 130 (the gate width: 0) as a reference.

The result shows that Tf is shortened as the gate width of the third transistor is increased. Although not shown, the rise time Tr has a similar tendency.

The above results confirmed that the use of a transistor through which a larger amount of current can flow is suitable to discharge gate stored charge of the current mirror circuit rapidly and to shorten Tf and Tr. Note that although the circuit simulation in this example was performed only on the gate width, an effect similar to that in the case where the gate width is increased can be obtained when the gate length is reduced.

This application is based on Japanese Patent Application serial No. 2010-228046 filed with Japan Patent Office on Oct. 8, 2010, the entire contents of which are hereby incorporated by reference.

What is claimed is:

1. A photoelectric conversion device comprising:
   a photodiode;
   a first transistor;
   a plurality of second transistors; and
   a third transistor,
   wherein an anode of the photodiode is electrically connected to a drain electrode and a gate electrode of the first transistor, and gate electrodes of the plurality of second transistors,
   wherein a cathode of the photodiode and drain electrodes of the plurality of second transistors are electrically connected to a first terminal,
   wherein a source electrode of the first transistor and source electrodes of the plurality of second transistors are electrically connected to a second terminal,
   wherein the third transistor is a diode-connected transistor, and
   wherein the third transistor is electrically connected in parallel with the photodiode.

2. The photoelectric conversion device according to claim 1, wherein the first terminal is electrically connected to a circuit configured to select a high power supply potential and a ground potential, and the second terminal is electrically connected to a wiring supplying a low power supply potential.

3. The photoelectric conversion device according to claim 1, wherein the first to third transistors are n-channel transistors.

4. The photoelectric conversion device according to claim 1, wherein the third transistor comprises an oxide semiconductor.

5. The photoelectric conversion device according to claim 1, wherein a gate width of the third transistor is larger than a gate width of the first transistor.

6. The photoelectric conversion device according to claim 1, wherein a gate length of the third transistor is smaller than a gate length of the first transistor.

7. A photoelectric conversion device comprising:
   a photodiode;
   a first transistor;
   a plurality of second transistors; and
   a third transistor,
   wherein an anode of the photodiode is electrically connected to a drain electrode and a gate electrode of the first transistor, gate electrodes of the plurality of second transistors, and a drain electrode and a gate electrode of the third transistor,
   wherein a cathode of the photodiode, drain electrodes of the plurality of second transistors, and a source electrode of the third transistor are electrically connected to a first terminal,
   wherein a source electrode of the first transistor and source electrodes of the plurality of second transistors are electrically connected to a second terminal,
   wherein the third transistor is a diode-connected transistor, and wherein the third transistor is electrically connected in parallel with the photodiode.

8. The photoelectric conversion device according to claim 7, wherein the first terminal is electrically connected to a circuit configured to select a high power supply potential and a ground potential, and the second terminal is electrically connected to a wiring supplying a low power supply potential.

9. The photoelectric conversion device according to claim 7, wherein the first to third transistors are n-channel transistors.

10. The photoelectric conversion device according to claim 7, wherein the third transistor comprises an oxide semiconductor.

11. The photoelectric conversion device according to claim 7, wherein a gate width of the third transistor is larger than a gate width of the first transistor.

12. The photoelectric conversion device according to claim 7, wherein a gate length of the third transistor is smaller than a gate length of the first transistor.

13. A photoelectric conversion device comprising:
a photodiode;
a first transistor;
a plurality of second transistors; and
a third transistor,
wherein a cathode of the photodiode is electrically connected to a drain electrode and a gate electrode of the first transistor, and gate electrodes of the plurality of second transistors,
wherein a source electrode of the first transistor and source electrodes of the plurality of second transistors are electrically connected to a first terminal,
wherein an anode of the photodiode and drain electrodes of the plurality of second transistors are electrically connected to a second terminal,
wherein the third transistor is a diode-connected transistor, and
wherein the third transistor is electrically connected in parallel with the photodiode.

14. The photoelectric conversion device according to claim 13, wherein the first terminal is electrically connected to a circuit configured to select a high power supply potential and a ground potential, and the second terminal is electrically connected to a wiring supplying a low power supply potential.

15. The photoelectric conversion device according to claim 13, wherein the first to third transistors are p-channel transistors.

16. The photoelectric conversion device according to claim 13, wherein the third transistor comprises an oxide semiconductor.

17. The photoelectric conversion device according to claim 13, wherein a gate width of the third transistor is larger than a gate width of the first transistor.

18. The photoelectric conversion device according to claim 13, wherein a gate length of the third transistor is smaller than a gate length of the first transistor.

19. A photoelectric conversion device comprising:
a photodiode;
a first transistor;
a plurality of second transistors; and
a third transistor,
wherein a cathode of the photodiode is electrically connected to a drain electrode and a gate electrode of the first transistor, gate electrodes of the plurality of second transistors, and a source electrode of the third transistor,
wherein a source electrode of the first transistor, source electrodes of the plurality of second transistors, and a drain electrode and a gate electrode of the third transistor are electrically connected to a first terminal,
wherein an anode of the photodiode and drain electrodes of the plurality of second transistors are electrically connected to a second terminal,
wherein the third transistor is a diode-connected transistor, and
wherein the third transistor is electrically connected in parallel with the photodiode.

20. The photoelectric conversion device according to claim 19, wherein the first terminal is electrically connected to a circuit configured to select a high power supply potential and a ground potential, and the second terminal is electrically connected to a wiring supplying a low power supply potential.

21. The photoelectric conversion device according to claim 19, wherein the third transistor comprises an oxide semiconductor.

22. The photoelectric conversion device according to claim 19, wherein a gate width of the third transistor is larger than a gate width of the first transistor.

23. The photoelectric conversion device according to claim 19, wherein a gate length of the third transistor is smaller than a gate length of the first transistor.

* * * * *